United States Patent [19]

Neely

[11] 4,424,455
[45] Jan. 3, 1984

[54] GLITCH ELIMINATING DATA SELECTOR

[75] Inventor: Eric D. Neely, Phoenix, Ariz.

[73] Assignee: Motorola, Inc., Schaumburg, Ill.

[21] Appl. No.: 370,711

[22] Filed: Apr. 22, 1982

[51] Int. Cl.³ .................... H03K 19/007; H03K 19/01
[52] U.S. Cl. .................................... 307/243; 307/446; 307/458; 307/513; 307/442
[58] Field of Search ............... 307/243, 244, 262, 445, 307/513, 446, 456, 457, 458, 290, 291, 292, 442

[56] References Cited

U.S. PATENT DOCUMENTS

| | | | |
|---|---|---|---|
| 2,909,678 | 10/1959 | Jensen | 307/291 |
| 3,054,910 | 9/1962 | Bothwell | 307/290 |
| 3,222,547 | 12/1965 | Boan et al. | 307/513 |
| 3,914,628 | 10/1975 | Pao et al. | 307/456 |
| 4,321,490 | 3/1982 | Bechdolt | 307/456 |
| 4,330,723 | 5/1982 | Griffith | 307/456 |

Primary Examiner—John S. Heyman
Attorney, Agent, or Firm—Vincent B. Ingrassia

[57] ABSTRACT

A data selection circuit selectively generates first and second complementary signals in response to an input signal so as to enable specific data paths and disable others. The circuit includes a non-inverting portion which generates an output signal having the same sense as the input signal, and an inverting portion which inverts the input signal. Since the non-inverting portion has an extra inverting stage within it, a diode is coupled between the inverting portion and the true output for steering base drive away from the inverting portion when the input signal makes a low to high transition. In this manner, the inverting output is prevented from going low until the non-inverting goes high.

5 Claims, 1 Drawing Figure

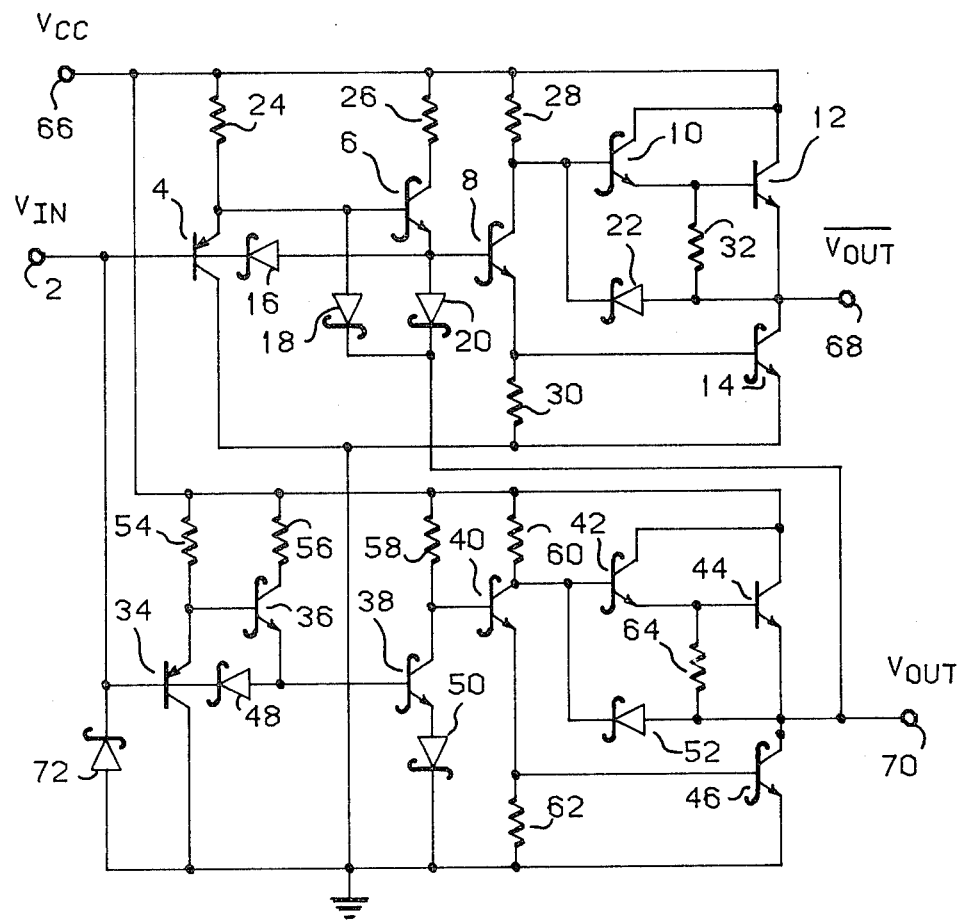

GLITCH ELIMINATING DATA SELECTOR

BACKGROUND OF THE INVENTION

This invention relates generally to multiplexing circuits and, more particularly, to a data selection circuit which generates first and second complementary outputs for enabling first and second data paths.

Data selector circuits, of the type with which this invention is concerned, generate first and second complementary output signals which are in turn coupled to different data paths for selectively enabling said data paths. That is, a data path will be enabled only if the data selector output coupled thereto in a first state (generally a logical "one") and will be disabled if the data selector output is in a second state (generally a logical "zero"). When one of the data paths is enabled (selected), it is necessary that the other data path be disabled (deselected). Unfortunately, known circuits do not preclude the possibility of both data selector outputs being simultaneously at the logical "zero" level for a brief period of time when the input signal is switched from a logical "zero" to a logical "one". This condition may be referred to as "dual deselection" and results in a glitch which may seriously degrade the data being transmitted.

SUMMARY OF THE INVENTION

It is an object to the present invention to provide an improved data selector circuit.

It is a further object of the present invention to provide an improved data selector circuit including apparatus for preventing the circuits inverting output from becoming a logical "zero" prior to the non-inverting output becoming a logical "one" when the input changes from a logical "zero" to a logical "one".

According to a first aspect of the invention there is provided a data selection circuit for selectively generating first and second complementary signals at first and second outputs thereof in response to an input signal which is capable of assuming first and second states, comprising: inverting circuit means adapted to be coupled to said input signal for generating said first signal at said first output; non-inverting circuit means adapted to be coupled to said input signal for generating said second signal at said second output; and first means coupled between said inverting circuit means and said second output for preventing said first and second outputs from simultaneously being in said first state.

BRIEF DESCRIPTION OF THE DRAWINGS

The above and other objects, features and advantages of the present invention will be more clearly understood from the following detailed description taken in conjunction with the accompanying drawing which is a schematic diagram of the inventive data selector circuit.

DESCRIPTION OF THE PREFERRED EMBODIMENT

Referring to the drawing, the inventive data selective circuit comprises an inverting section and a non-inverting section. The inverting section comprises transistors 4, 6, 8, 10, 12, and 14, diodes 16, 18, 20, and 22, and resistors 24, 26, 28, 30, and 32. The non-inverting section comprises transistors 34, 36, 38, 40, 42, 44, and 46, diodes 48, 50, 52, and 72, and resistors 54, 56, 58, 60, 62, and 64.

Referring first to the inverting section, an input voltage ($V_{IN}$) appearing at terminal 2 is applied to the base of an input PNP transistor whose emitter is coupled via resistor 24 to a source of supply voltage ($V_{CC}$) appearing at terminal 66. The emitter of transistor 4 is also coupled to the anode of Schottky diode 18 and to the base Schottky transistor 6. The collector of transistor 6 is coupled via resistor 26 to the source of supply $V_{CC}$, and the emitter of transistor 6 is coupled to the base of Schottky transistor 8, and the anode of Schottky diode 20, and to the anode of Schottky diode 16. The cathode of Schottky diode 16 is coupled to the base of transistor 4. The collector of transistor 8 is coupled to the base of Schottky transistor 10, to the cathode of Schottky diode 22, and, via resistor 28, to the source of supply voltage $V_{CC}$. The emitter of transistor 8 is coupled to the base of Schottky transistor 14 and, via resistor 30, to ground. The emitter of transistor 10 is coupled to the base of NPN transistor 12 and, via resistor 32, to the anode of Schottky diode 22 and to the junction of the emitter of transistor 12 and the collector of Schottky transistor 14 which is in common with output terminal 68 at which the inverted output ($\overline{V_{out}}$) appears. The collectors of both transistors 10 and 12 are coupled to the source of supply voltage $V_{CC}$ while the emitter of transistor 14 is coupled to ground. Transistor 4 may be referred to as an input transistor while Schottky transistor 6 is a buffer transistor. Transistor 8 is a phase splitter transistor and transistors 10, 12 and 14 are included in what may be referred to as a push-pull output stage.

The non-inverting portion of the circuit includes an input PNP transistor 34, a buffer transistor 36, an inverting transistor 38, a phase splitter transistor 40 and an output push-pull stage including transistors 42, 44 and 46. The input signal $V_{IN}$ appearing at terminal 2 is applied to the base of input transistor 34. The emitter of transistor 34 is coupled to the base of Schottky transistor 36 and, via resistor 54, to the source of supply voltage $V_{CC}$. The collector of Schottky transistor 36 is coupled, via resistor 56, to $V_{CC}$, and the emitter of transistor 36 is coupled to the base of Schottky transistor 38 and to the anode of Schottky diode 48. The cathode of diode 48 is coupled to the base of transistor 34. The collector of transistor 38 is coupled to the base of Schottky transistor 40 and, via resistor 58, to $V_{CC}$ while the emitter of transistor 38 is coupled via diode 50 to ground. The collector of transistor 40 is coupled to the base of Schottky transistor 42, the cathode of Schottky diode 52 and, via resistor 60, to $V_{CC}$. The emitter of transistor 40 is coupled to the base of Schottky transistor 46 and, via resistor 62, to ground. The emitter of transistor 42 is coupled to the base of NPN transistor 44 and, via resistor 64, to the anode of Schottky diode 52 and to the junction of the emitter of transistor 44 and the collector of Schottky transistor 46 which junction is in common with the non-inverting output terminal 70 ($V_{out}$). The collector terminals of transistors 42 and 44 are coupled to $V_{CC}$ while the emitter terminal of transistor 46 is coupled to ground.

The inventive selector circuit shown in the drawing operates as follows. With a low voltage at terminal 2 ($V_{IN}$ is a logical "zero") input transistor 4 is rendered conductive which in turn renders transistor 6 nonconductive. Since no base drive is being supplied to transistor 8, transistor 8 remains off causing transistors 10 and 12 to be rendered conductive. With transistor 8 off, no base drive is supplied to transistor 14 keeping it off.

Thus, the voltage at terminal 68 ($V_{\overline{out}}$) will go high; i.e. $V_{\overline{out}}$ becomes a logical "one".

Since a low voltage exists at input terminal 2, transistor 34 will become conductive causing transistor 36 to be rendered nonconductive so as not to supply base drive to transistor 38 to turn it on. With transistor 38 off, transistor 40 is turned on causing base drive to be diverted from transistor 42 and supplied to the base of transistor 46 turning transistor 46 on. With transistor 42 turned off, transistor 44 is likewise off and thus the voltage at output terminal 70 ($V_{out}$) will go low; i.e. $V_{out}$ becomes a logical "zero".

When $V_{IN}$ at terminal 2 switches from a low to a high (i.e. from a logical zero to a logical one) both input transistors 4 and 34 will begin to turn off. Ignoring Schottky diodes 18 and 20 for the time being, Schottky transistor 6 will begin to turn on when input transistor 4 turns off. When transistor 6 is sufficiently on, there will be sufficient base drive to transistor 8 likewise turning it on. This will cause transistor 14 to become conductive and transistors 10 and 12 to become nonconductive casing output terminal 68 to go low; i.e. $V_{\overline{out}}$ becomes a logical zero.

In response to transistor 34 turning off, transistor 36 will turn on supplying base drive to transistor 38. When transistor 38 turns on, transistor 40 will turn off removing base drive from transistor 46 and supplying base drive to transistor 42. Thus, transistor 46 turns off and transistor 44 turns on causing the output voltage $V_{out}$ at terminal 70 to go high; i.e. $V_{out}$ becomes a logical "one".

As can be seen, the non-inverting portion of the circuit includes one additional inverting stage when compared to the inverting portion of the circuit. Thus, when the input voltage switches from a logical zero to a logical one, the inverting output terminal 68 may be driven low prior to the non-inverting output 70 being driven high. Thus, for some period of time, both outputs $V_{out}$ and $V_{\overline{out}}$ would be low. To avoid this, a Schottky diode 18 is placed between the base of transistor 6 in the inverting portion of the circuit and the junction of the emitter of transistor 44 and the collector of transistor 46 in a noninverting portion of the circuit. Thus, when the input voltage $V_{IN}$ goes from a low to a high causing transistor 4 to turn off, Schottky diode 18 diverts base drive from transistor 6 causing transistor 6 to remain off which in turn causes transistors 8 and 14 to remain off. Thus, the voltage at terminal 68 remains high. When the collector of transistor 46 reaches the threshold for transistors 6, 8 and 14 due to the input voltage switching from a low to high level, Schottky diodes 18 and 20 become reverse biased. Thus, base drive is supplied to transistor 6 turning it on. Once transistor 6 is turned on, base drive is applied to transistor 8 turning it on which in turn causes transistor 14 to become conductive and output terminal 68 to go low. As can be seen, output terminal 68 cannot go low until output terminal 70 reaches a high enough level thus avoiding the problem of dual deselection. Schottky diode 20 serves merely to divert current which may be coupled via diode 16 into the base of transistor 8 during the low-to-high transition at terminal 2.

Schottky diodes 16 and 48 are placed between the base of transistors 8 and 38 respectively and transistors 4 and 34 respectively for the purpose of removing charge when the input voltage at terminal 2 goes low. Resistors 30 and 62 provide base charge removal paths for transistors 14 and 46 respectively. Resistor 32 in conjunction with Schottky diode 22 provides a means for removing charges from the base of transistor 12 while resistor 64 in conjunction with diode 52 provides a charge removal path for transistor 44. Furthermore, since the anodes of diodes 22 and 52 are coupled to output terminals 68 and 70 respectively, diodes 22 and 52 provides means for discharging capacitive loads. Finally, resistors 24, 26, 28, 54, 56, 58, and 60 are merely bias resistors to set appropriate current levels.

Diode 72 assures that the voltae $V_{IN}$ at terminal 2 does not fall significantly below ground.

The above description is given by way of example only. Changes of form and details may be made by one skilled in the art without the parting from the scope of the invention. For example, reference has been made throughout the specification of Schottky diodes and Schottky transistors. It would be clear to one skilled in the art that such devices may be replaced by traditional diodes and transistors and still yield an operative circuit.

I claim:

1. A data selection circuit for selectively generating first and second complementary signals at first and second outputs thereof in response to an input signal which is capable of assuming first and second states, comprising:

inverting circuit means adapted to be coupled to said input signal for generating said first signal at said first output, said inverting circuit means comprising,
  a first transistor having a base adapted to be coupled to said input signal, an emitter adapted to be coupled to a first source of supply voltage, and a collector adapted to be coupled to a second source of supply voltage,
  a second transistor having a base coupled to the emitter of said first transistor,
  a collector adapted to be coupled to said first source of supply voltage and having an emitter,
  a first inverting stage having an input coupled to the emitter of said second transistor, and
  a first push-pull output stage coupled between said first output and an output of said first inverting stage;
non-inverting circuit means adapted to be coupled to said input signal for generating said second signal at said second output, said noninverting circuit means comprising,
  a second input stage for receiving said input signal,
  a second inverting stage having an input coupled to an output of said second input stage,
  a third inverting stage having an input coupled to an output of said second inverting stage, and
  a second push-pull output stage coupled between said second output and an output of said third inverting stage; and
diode means coupled between said second output and the junction of the emitter of said first transistor and the base of said second transistor, so as to conduct current from said junction to said second output for preventing said first and second outputs from simultaneously being in said first state.

2. A circuit according to claim 1 wherein said diode means comprises a Schottky diode.

3. A circuit according to claim 1 wherein said first inverter stage comprises a third transistor having a collector adapted to be coupled to said first source of supply voltage, an emitter adapted to be coupled to said second source of supply voltage, and a base coupled to the emitter of said second transistor.

4. A circuit according to claim 3 further including additional diode means coupled between the base of said third transistor and said second output.

5. A circuit according to claim 4 wherein said first push-pull output stage comprises:
- a fourth transistor having a base coupled to the collector of said third transistor, a collector adapted to be coupled to said first source of supply voltage, and having an emitter;
- a fifth transistor having a base coupled to the emitter of said fourth transistor, a collector adapted to be coupled with said first source of supply voltage and an emitter coupled to said first output; and
- a sixth transistor having a base coupled to the emitter of said third transistor, an emitter adapted to be coupled to said second source of supply voltage and a collector coupled to said first output.

* * * * *